(12) United States Patent
Callahan, Jr.

(10) Patent No.: US 6,900,672 B2
(45) Date of Patent: May 31, 2005

(54) DRIVER CIRCUIT HAVING A SLEW RATE CONTROL SYSTEM WITH IMPROVED LINEAR RAMP GENERATOR INCLUDING GROUND

(75) Inventor: Michael J. Callahan, Jr., Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/401,623

(22) Filed: Mar. 28, 2003

(65) Prior Publication Data

US 2004/0189362 A1 Sep. 30, 2004

(51) Int. Cl.$^7$ ................................. H03B 1/00
(52) U.S. Cl. ................ 327/108; 327/170; 327/132
(58) Field of Search ................. 327/170, 108, 327/111, 261, 130–134, 136, 53, 66; 323/312, 313, 315

(56) References Cited

U.S. PATENT DOCUMENTS

| | | | |
|---|---|---|---|
| 4,803,381 A | | 2/1989 | Gornati et al. |
| 5,177,374 A | | 1/1993 | Carpenter et al. |
| 5,191,269 A | | 3/1993 | Carobolante |
| 5,306,988 A | | 4/1994 | Carobolante et al. |
| 5,311,115 A | * | 5/1994 | Archer ................ 323/315 |
| 5,374,857 A | | 12/1994 | Carobolante |
| 5,428,303 A | * | 6/1995 | Pasqualini .............. 326/27 |
| 5,512,854 A | | 4/1996 | Park |
| 5,514,939 A | | 5/1996 | Schlager et al. |
| 5,627,487 A | | 5/1997 | Keeth |
| 5,712,509 A | | 1/1998 | Harada et al. |
| 5,714,897 A | | 2/1998 | Victunic et al. |
| 5,739,707 A | | 4/1998 | Barraclough |
| 5,742,193 A | * | 4/1998 | Colli et al. .............. 327/170 |
| 5,767,708 A | | 6/1998 | Groeneveld et al. |
| 5,825,218 A | | 10/1998 | Colli et al. |
| 5,828,245 A | * | 10/1998 | Brambilla et al. .......... 327/108 |
| 5,883,798 A | | 3/1999 | Yamaguchi |
| 5,939,909 A | | 8/1999 | Callahan, Jr. |
| 6,169,456 B1 | | 1/2001 | Pauls |
| 6,586,980 B1 | * | 7/2003 | Callahan, Jr. ............ 327/170 |
| 6,650,153 B2 | * | 11/2003 | Zerilli et al. ............. 327/134 |

OTHER PUBLICATIONS

Gariboldi, "Motion Control," appearing in *Smart Power ICs*, Murari et al., Eds., 1995, Ch. 6, pp. 225–283.
Grebene, "Bipolar and MOS Analog Integrated Circuit Designs," 1984, Sec. 4.1, pp. 171–183, and Sec. 6.2, pp. 272–277.

* cited by examiner

*Primary Examiner*—Timothy P. Callahan
*Assistant Examiner*—Hai L. Nguyen
(74) *Attorney, Agent, or Firm*—Lisa K. Jorgenson; Renee Michelle Larson

(57) ABSTRACT

Methods and structures for ensuring the highly linear discharge of a capacitor used for slew rate control of a power driving stage from a maximum voltage to a minimum supply voltage, such as ground. A voltage ramp generator uses a single cascoded current source to achieve the linear rampdown.

14 Claims, 4 Drawing Sheets

DRIVER CIRCUIT HAVING A SLEW RATE CONTROL SYSTEM WITH IMPROVED LINEAR RAMP GENERATOR INCLUDING GROUND

BACKGROUND OF THE INVENTION

1. Field of the Invention

The present invention relates generally to drive circuits for a power device of a power driving stage, and, more particularly, to a driver circuit operating from a supply voltage (e.g. a charge pump voltage) that is higher than the supply voltage of the power device.

2. Description of Related Art

A driver circuit is generally a relatively low power circuit that drives, or controls, a higher power device. The power device may be part of a power driving stage for a load. An example is a load that is a motor, such as a brushless motor, that provides the motive force for a spindle of a hard disk drive. Similar driver circuits are applied elsewhere, such as in voice coil motor (VCM) systems.

One of the most widely used types of driver circuits in such applications uses a three-phase brushless motor in a configuration in which current energizes respective motor coils using a full wave bridge configuration. The bridge includes two power stages for each phase, so typically there are six power stages, each with a power device. Three of the power stages, and their power devices, are referred as being "low side" stages and devices because they are connected between a motor coil and ground. The other three of the power stages, and their power devices, are referred to as "high side" stages and devices because they are connected between a power supply and a motor coil.

The power devices are operated as switches in a sequence that allows pulses of current to flow from the power supply through a high side power device, a coil of a first of the three stages, a coil of a second of the three stages, and then through a low side power device to ground. This process is repeated in a generally well known manner for the other power devices and coil pairs to achieve three phase energization from a single, direct current, power supply. The switching, or commutation, characteristics of the power devices are very important in achieving good performance from the motor and other favorable characteristics.

Control of the switching of the power devices is performed by a driver circuit for each power device. In the typical use described above with six power stages, there are three low side drivers and three high side drivers. The power devices may be of a variety of electronic switch devices and the driver circuits are configured suitably for the power devices. Power devices of general application to hard disk drivers, and the like, are each often an MOS (metal-oxide-semiconductor) FET (field effect transistor). One type of such transistors of considerable interest is referred to as a DMOS transistor (double diffusion MOS).

DMOS devices can be readily integrated in chips with other circuitry, including power control circuitry. So it is attractive to have an entire set of drive stages, including all the power devices and all the driver circuits for the power devices, in one chip.

Even where all the power devices are alike, e.g. N channel DMOS devices, it is generally the case that the high side drivers differ from the low side drivers because high side drivers for such power devices often require a voltage, referred to as a charge pump voltage or boost voltage, at a higher voltage level than that supplied by the power supply for the power stages. By known techniques, a charge pump voltage may be generated from the supply voltage and used by all of the high side drivers. Such an auxiliary supply if present, however, is power limited; the desired voltage can be supplied but at a modest current level.

The field of motion control using integrated signal and power components, the. respective requirements of low and high side drivers, and the characteristics sought in applications of motor drivers are described more fully in *Smart Power ICs*, by B. Murari et al;, Eds., 1995, particularly Chapter 5, "Motion Control" by R. Gariboldi, at pp. 225–283, which is herein incorporated by reference for its description of background to the present invention.

As is disclosed, for example from the above-mentioned Gariboldi publication, for applications such as hard disk drives it is of utmost importance to control the output voltage slope in order to reduce electromagnetic interference (EMI). Generally, the slope is desired to be steep, but not so abrupt as to cause any appreciable noise. Drive circuits have therefore generally included slew rate control circuits to achieve fast, smooth transitions.

In a typical slew rate control system, a capacitor is charged and discharged by two current generators. Preferably, one wishes to have the same smooth, linear commutation both in going off-to-on and on-to-off. Also, one wishes to have the gate voltage change over a range from ground, or zero, to the maximum supply voltage, or at least a voltage that assures full turn-on of the power device. The circuitry for doing so is referred to as a voltage ramp generator. It can be achieved, by typical integration techniques, using basic current mirrors, one of a pair of matched PNP bipolar transistors on the high side of the drive and the other of a pair of matched NPN bipolar transistors on the low side of the drive. Each pair of the transistor structures has one with a base-collector connection so the device acts as a diode. The diode is connected to the base of the other matched transistor. In some applications, this can produce good linearity for much of the supply voltage range, but is limited by collector-emitter saturation voltages near ground and near the positive voltage. Generally, problems in achieving the desired linearity increase as the supply voltage is increased. The greater precision with which linearity is achieved means that less noise can occur to affect the driver or its load.

An approach for attaining linearity at higher voltages than that for which the basic current mirror is suitable would be to use cascoded current mirrors. A description of basic cascoded current mirrors and their use in constant-current stages is contained, for example, in *Bipolar and MOS Analog Integrated Circuit Design* by Alan B. Grebene, Sec. 4.1, pp. 170–183, which is herein incorporated by reference. However, a single cascoded solution is not effective because it is not capable of ramping down to zero volts. The PN junction effects of the cascode-connected transistors mean an inherent higher lower voltage limit. The inability to go to zero volts is unacceptable for a high performance drive.

Similar problems are encountered with current mirrors or cascoded current mirrors made up of MOSFET (metal-oxide-semiconductor-field-effect-transistor) devices. Basic MOSFET current mirrors are also limited as far as providing good linearity in ramping with voltages encountered in integrated circuit charge pump supplies. Cascode connected MOSFETs provide a better degree of linearity but lack the ability to ramp down to a zero level to ensure turn off of a power device. There are inherent gate to source voltage drops of MOSFETs that prevent a satisfactory reduction in voltage. The book of Grebene cited above also describes the nature and use of MOSFET current mirrors, at Sec. 6.2, pp. 271–277, and is herein incorporated by reference.

Referring now to FIG. 1, a circuit schematic diagram of a representative prior art voltage ramp generator is shown. A DC supply of a voltage Vcc is applied across a combination of current generators and a capacitor C, which may, for example, be a slew rate control capacitor of a driver circuit. The current generators, also referred to as constant current sources, include a first current source Ic that is connected between the supply and the capacitor C for charging the capacitor. A second current source Id for discharging the capacitor C is connected to the capacitor's high side or charge terminal, as is source Ic, and to ground. A switch Sw1 is connected in a position to make or break a connection between source Ic and the capacitor C. Switch Sw1 is activated by command logic signals (COM) applied from other circuitry. A switch SW2 is connected to make or break a connection between source Id and capacitor C; it receives command signals through an inverter connected to the COM signals.

When a command signal is received to close Sw1, source Ic will charge up the capacitor to an elevated voltage near Vcc while Sw2 remains open. When a command signal is received to open Sw1, Sw2 closes and source Id will discharge C. Source Ic and source Id can each be designed to carry currents sufficient to provide substantially matching slew rates for the capacitor voltage Vout. For example, Ic and Id may each be designed to conduct a current of magnitude 1. The slew rate or slope of the capacitor voltage Vout is therefore I/C both during charging and discharging.

FIG. 2 illustrates a further example of a prior art voltage ramp generator and is a more specific example of the general configuration of FIG. 1. Relating the elements to FIG. 1, a current source Ic connected to a pair of matched PNP transistor structures Q1 and Q2 connected as a basic current mirror between the supply Vcc and capacitor C. Transistor Q1 has a direct connection between its base and collector and operates as a diode. A discharging current source Id connected to a pair of matched NPN transistor structures Q3 and Q4, which are also connected as a basic current mirror in which Q3 has its collector and based connected to operate as a diode.

In the drawings, a symbol in the form of a pair of overlapping circles is used to represent a current source and to inform one that in addition to the illustrated transistors, there are resistors and/or other elements for transistor biasing in accordance with known current source practice. The switches shown in the drawings may be suitable semiconductor switches, such as field effect transistors, in accordance with known practice.

FIG. 3 shows an example of performance sought to be realized by voltage ramp generators like those of FIG. 2. Part A of FIG. 3 shows changes in Vout occurring as a result of command signals (COM) shown in part B on the same time axis. A command signal is either a logic "0" or "1." Here a "0" command is the signal to start discharging. The signal at time t(0) starts that process. The slew rate of Vout is I/C, where I is the current of source Id. At time t1 the discharge is completed and Vout remains zero until a command signal of "1" is received at time t2. That starts the charging process with substantially the same slope of slew rate, but one determined by the current of source Ic. At time t3, Vout is at its maximum. Vout remains at that level until a further "0" command is received at time t4 and the discharge process begins again.

FIG. 3 is not intended to show exact values of capacitor voltage Vout. For circuits such as FIG. 2, a maximum Vout is not quite the supply voltage Vcc but is equal to Vcc minus a collector-emitter saturation voltage (e.g., for Q2 of FIG. 2) of Vcesat. The minimum Vout is above ground voltage by an amount equal to the collector-emitter saturation voltage (e.g. for Q4 of FIG. 2). The results achieved in FIG. 2 are generally suitable for driver circuits. The minimum Vout is effectively "zero" and sufficient to enable turning off a power device despite the voltage difference mentioned above.

As described above, the operation of some power stages requires a driver circuit operating from a voltage elevated above the power device supply Vcc, such as by about 10 v. The elevated charge pump voltage Vcp, can be generated in an integrated circuit from Vcc by known techniques. The higher voltage makes basic current mirrors like those of FIG. 2 perform their ramping functions with a less linear characteristic. In a straightforward integrated circuit design, the imposition of higher voltages on current sources could lead one to change from basic current mirrors as in FIG. 2 to cascode connected current mirrors. In contrast to FIG. 2 having a current mirror with transistor structures such as Q1 and Q2 in a current source, one could have two cascoded current mirrors in each current source both for charging and discharging. The extra transistors of the additional current mirrors are not appreciably difficult to integrate so the ability to achieve good linearity with higher output voltage may initially make cascoded current mirrors appear successful in satisfying the need of high performance driver circuits.

Operating of a voltage ramp generator with cascoded current mirrors, with for example a voltage Vcp about 10 v. higher than Vcc, is generally the same as the generator of FIG. 2 but with a serious drawback. The maximum voltage is not a major problem; ramping up to a voltage close enough to Vcp can usually be readily achieved. However, the minimum voltage is a serious problem. There should be no appreciable voltage at the minimum (i.e. Vout should be substantially "zero" in order to completely turn off the power device being driven). The extra voltage drop introduced by the cascoded current mirrors, as compared to a basic configuration as in FIG. 2, can be enough to prevent turn-off of the power device.

U.S. Pat. No. 5,825,218 issued on Oct. 20, 1998 to Colli et al., which is herein incorporated by reference in its entirety, addresses these concerns with a voltage ramp generator for a driver circuit that is designed to produce a capacitor output voltage Vout that is highly linear between zero and a maximum voltage. Two current sources are employed, one cascoded and one not cascoded; a comparator makes a decision to switch from the first, cascoded current source to the second current source when the capacitor output voltage Vout goes low enough. The first current source takes the capacitor voltage to a low value but not all the way down to ground. When the comparator makes the decision to switch, the second current source then takes the capacitor voltage Vout substantially to zero (ground).

While this approach of U.S. Pat. No. 5,825,218 achieves a linear slope of Vout between the maximum voltage and ground, there is the possibility of having a difference in slopes at the switch-over point due to the fact that two separate current sources are being used. There is no teaching in the U.S. Pat. No. 5,825,218 on how such a matching error could be suppressed.

In addition to this concern with mismatch in slopes at the switch-over point between two current sources, a second linearity term of interest is caused by one transistor of a current mirror being in saturation while the other transistor of the current mirror is not. This issue is of concern in U.S. Pat. No. 5,825,218 as well as other prior art circuits. While the voltage ramp generator of U.S. Pat. No. 5,825,218 generally provides a highly linear ramp down of Vout towards ground, there is characteristically a slight deviation from linearity in the ramp as the ramp voltage Vout approaches ground. This linearity error by the mismatch in operating regions between the reference and mirror transistors of a current mirror; as Vout is lowered, the mirror transistor may move from the saturation region into the linear region while the reference transistor of the current mirror remains in the saturated region of operation. As the mirror transistor goes into the triode, or linear, region, its drain current decreases, thereby causing the capacitor to discharge at a slower rate. It is this slower rate of discharge of the capacitor that causes the linearity deviation.

SUMMARY OF THE INVENTION

It is an object of the present invention to achieve accurate, precise slew rate control for devices such as spindle motor drives.

Therefore, according to the present invention, three embodiments are shown, each capable of linearly discharging a capacitor for slew rate control of a power driving stage from a maximum voltage to a minimum supply voltage, such as ground, in a highly linear fashion. The capacitor may be coupled to any suitable low impedance voltage potential, such as ground. According to a first embodiment of the present invention, a voltage ramp generator has a decision-making element and a cascoded current source. The decision-making element is provided with a reference voltage and an output voltage of the capacitor and is coupled to the ground voltage and a supply voltage; the capacitor is coupled to any suitable low impedance voltage potential, such as ground or any other suitable high impedance potential. The cascoded current source is coupled to the output voltage of the capacitor and ground. When the decision-making element detects that the output voltage of the capacitor has discharged to a predetermined interim voltage that is less than the reference voltage, the decision-making element generates a control signal that causes the current source to ramp down the output voltage of the capacitor from the predetermined interim voltage to ground.

According to a second embodiment of the present invention, a voltage ramp generator has a cascoded current source that has a current mirror, at least a first cascode device coupled to the output voltage of the capacitor in the mirror leg of the current mirror, and at least a first biasing device coupled to a supply voltage in the reference leg of the current mirror for biasing the at least first cascode device. The current mirror and the first cascode device operate in a saturated or high resistance region as the output voltage of the capacitor falls from the maximum voltage to ensure a high impedance of the output voltage of the capacitor until the output voltage of the capacitor reaches a first interim voltage. When the output voltage of the capacitor reaches the first interim voltage the first cascode device operates in a linear or low resistance region, the current mirror transistor continues to operate in the high resistance region, and the output voltage of the capacitor is no longer as high of an impedance, but the output voltage being at or below the first interim voltage does not require that the output voltage be as high an impedance to continue linearly discharging the capacitor to ground. A second biasing device and cascode device may be added to this current mirror configuration if desired.

According to a third embodiment of the present invention, the concern with slope mismatches at the switch-over point between two current sources as well as the linearity concern that results when the transistors of a current mirror are not in the same operating mode are both addressed. In its broadest sense, the third embodiment of the present invention is directed to an improvement in a high-impedance current source that has a wide voltage compliance range and high linearity. The current source has an input reference current coupled to a first supply voltage, a current mirror coupled to a second supply voltage, comprising a reference transistor in a reference leg and a mirror transistor in a mirror leg, with the mirror transistor is controlled in part by the reference transistor, and a biasing arrangement coupled between the input reference current and the current mirror and to an output voltage. The biasing arrangement operates to ensure that the reference transistor and the mirror transistor both operate in the same operating region, even if the mirror transistor transitions from a first operating region to a second operation region of possible operating regions, over a wide range of output voltages. The high-impedance current source of the third embodiment may be used in combination with a capacitor to create a ramp generator capable of discharging the capacitor for slew rate control of a power stage from a maximum voltage to the second supply or ground voltage. When the output voltage of the capacitor falls below a first interim voltage and the mirror transistor goes from a high resistance region of operation into a low resistance region of operation by a certain amount, the biasing arrangement causes the reference transistor to likewise enter the low resistance region of operation by the same amount while maintaining a predetermined current relationship between the reference transistor and the mirror transistor. This maintains the desired linear discharge of the capacitor closer to ground than previous circuits.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing(s), wherein:

DESCRIPTION OF THE INVENTION

Figure 4:
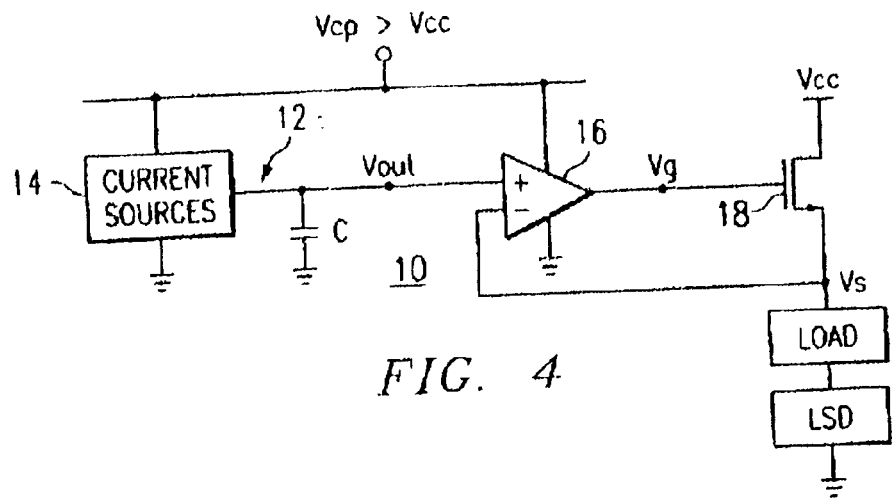
FIG. 4 is a circuit schematic of a driver circuit with a voltage ramp generator.

Referring to FIG. 4, a schematic diagram of a driver circuit with a voltage ramp generator illustrates the need for a wide range in linearity of the capacitor output voltage Vout. Drive circuit 10 has a voltage ramp generator 12 that includes capacitor C and current source 14. The voltage ramp generator 12 serves as a slew rate control system for the driver circuit. The driver circuit 10 also has an amplifier (or op-amp) 16 that receives an input at one terminal, which is Vout from the voltage ramp generator 12. The output from the amplifier 16 is the gate voltage Vg applied to a power device 18 which may be an N-channel DMOS device. Such a power device has a DC voltage applied to its channel by supply Vcc but requires that Vg range from zero, for complete turn-off, to a voltage substantially above Vcc for complete turn-on. A second power supply Vcp supplies a DC voltage to the current sources 14 and biases the amplifier 16. Vcp is greater than Vcc due to the requirements for Vg.

FIG. 4 shows the driver circuit 10 as a high side driver for a load, such as a spindle motor coils for a hard disk drive motor, which would have a low side driver, LSD, between it and ground. The driver output voltage Vs is applied to the load as well as back to an input of amplifier 16 as a feedback signal.

Basically, the voltage across the capacitor Vout is used to drive the power device 18. In order to turn off a power DMOS device, it is necessary to have a voltage between the gate and source of device 18 that is less than 1 volt. So it is very important that the voltage ramp generator provide a substantially "zero" Vout. However, if cascoded current mirrors are relied on as the only current sources in the voltage ramp generator, there is too much voltage drop of the low end of the slew voltage range to insure turn-off.

For driving device 18 on, Vg needs to go up to about 10 volts greater than Vcc. At the high end of the range, the cascoded mirrors would also cause an offset from Vcp due to voltage drops due to PN junction effects of about 2 Vbe when cascoded current mirrors of bipolar transistors are used. That may be satisfactory because Vcp can still be high enough to ensure that Vg is enough for full turn-on.

The present invention provides the voltage ramp generator with the ability to reach the required zero voltage level. It can also be applied in an embodiment with additional capability at the high voltage side so that Vout can match Vcp and provide an essentially full rail-to-rail ramp generator without sacrificing the quality or precision of linearity at the desired slew rate. The present invention is particularly beneficial for high side drivers in integrated circuits for energizing spindle motor coils, such as for hard disk drives.

Figure 5:
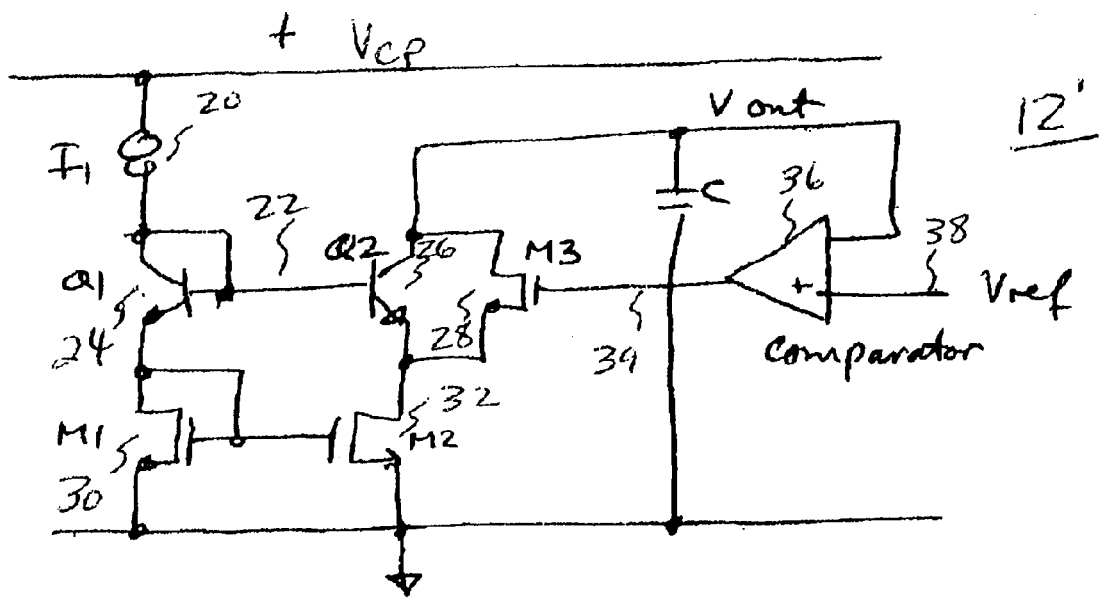
FIG. 5 is a voltage ramp generator in accordance with a first embodiment of the present invention.

Referring now to FIG. 5, a voltage ramp generator 12' in accordance with a first embodiment of the present invention is illustrated. Voltage ramp generator 12', unlike the prior art solutions, employs a cascoded current source 22 (as opposed to two current sources) having a cascode-connected pair of current mirrors. Voltage ramp generator 12' has the elements shown in the figure, including 11 reference current 20, Q1 bipolar transistor 24, Q2 bipolar transistor 26, M1 MOSFET 30, M2 MOSFET 32, M3 MOSFET 28, capacitor C, and comparator 36. Cascoded current source 22 has a current mirror is formed by M1 transistor 30 and M2 transistor 32 in current mirror formation, with diode-connected M1 transistor 30 in the reference leg and M2 transistor 32 in the mirror leg, Q2 cascode device 26, and diode-connected Q1 biasing device 24. For simplicity, only the sink or discharging cascoded current source of voltage ramp generator 12 is shown; one of ordinary skill in the art will recognize that a current source may be used to charge capacitor C of voltage ramp generator 12'.

When decision-making element comparator 36 senses that Vout voltage is getting too low to support the cascode, as determined by comparing Vout to Vref reference voltage 38, then the output signal 39 of comparator 36 shorts around Q2 transistor 26, effectively switching out Q2 bipolar transistor 26 and replacing it with M3 MOS transistor 28. The cascode device of cascoded current source 22 is now effectively M3 MOSFET 28, effectively causing current source 22 to operate as a non-cascoded current source. This allows the ramp waveform of the voltage ramp generator 12' to go all the way down to ground, with M3 MOS transistor 28 always being in the linear operating region, also referred to as the triode or low resistance region. Vref is chosen to be a voltage enough above zero to be in the range in which voltage ramp generator 12' is capable of efficiently providing linear ramping of the voltage. However, it is preferred that Vref be relatively small so that the non-cascoded current source 22 is required to conduct only over a small voltage.

The voltage ramp generator of FIG. 5 provides advantages over the prior art. The output voltage of the capacitor Vout is achieved in a highly linear manner from a maximum voltage down to a minimum ground voltage with much fewer required devices. The present invention uses a single cascoded current source to achieve this, instead of the at least two current sources and switch required in the prior art. The use of a single current source eliminates the matching error caused by the difference in slopes between two current sources at the switch-over point, discussed above.

Figure 6:
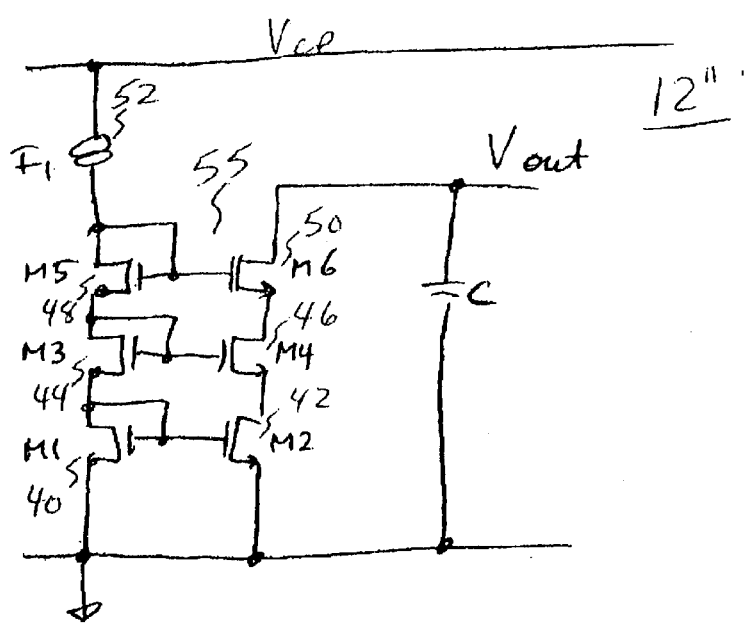
FIG. 6 is a voltage ramp generator in accordance with a second embodiment of the present invention.

Referring now to FIG. 6, a voltage ramp generator 12" in accordance with a second embodiment of the present invention is illustrated. Voltage ramp generator 12" is capable of linearly discharging a capacitor for slew rate control of the power device 18 from a maximum voltage to a minimum ground voltage. Voltage ramp generator 12" of the second embodiment again utilizes a cascoded current source 55 to achieve linear discharging of capacitor C, but does so exclusively with MOSFET devices as shown. The cascoded current source 55 is a double-cascode formation that ensures that an extremely high output impedance and thus ensures a highly linear ramp waveform. This embodiment does not require a comparator and does not perform any switching at all during the discharging of capacitor C.

Voltage ramp generator 12" has 11 reference current 52, M1 MOSFET device 40, M2 MOSFET device 42, M3 MOSFET device 44, M4 MOSFET device 46, M5 MOSFET device 48, M6 MOSFET device 50, and capacitor C. MOSFET devices M1, M2, M3, M4, M5, and M6 together define the cascoded current source 55; as will be explained below, the double cascode effect provided by MOSFET devices M5 and M6, while a valuable feature that creates an extremely high output impedance of Vout, is optional and not required for practice of the invention. Cascoded current source 55 is coupled between supply voltage Vcp, capacitor output voltage Vout and ground and is arranged in a double cascoded formation defined by a current mirror formed by M1 transistor 40 and M2 transistor 42, either one or two cascode devices (M4 transistor 46, M6 transistor 50) serially connected to M2 transistor 42, and either one or two biasing devices M3, M5 serially connected to M1 transistor 40 to bias M4 transistor 46, M6 transistor 50, respectively The current mirror formed by diode-connected M1 transistor 40 in the reference leg and M2 transistor 42 in the mirror leg is coupled to ground as shown. M3 MOSFET device 44 is diode-connected, as is M5 MOSFET device 48. M5 device 48 is coupled to Vcp supply voltage and MOSFET device 44 while M6 MOSFET device 60 is coupled to capacitor output voltage Vout and M4 MOSFET device 46.

The cascoded current source 55 of voltage ramp generator 12" is capable of linearly discharging capacitor C from a maximum voltage to a minimum ground voltage in order to accomplish slew rate control of a power driver device 18 of FIG. 4. Transistors 42, 46, and 50 all operate in the saturation or high resistance region as Vout falls from a maximum voltage towards zero volts until Vout falls to a interim voltage. When Vout reaches or falls below the interim voltage then at least one of these transistors will move from the saturation region to the linear, or low resistance, region of operation and correspondingly lower the output impedance of Vout. By the time that Vout falls to the interim voltage, however, this voltage is low enough that the lower output impedance does not have an adverse affect on the linearity of the discharging of capacitor C.

Cascoded current source 55 may be implemented in either a double-cascoded configuration with two cascode devices M4 MOSFET 46 and M6 MOSFET 50 as shown in FIG. 6 or a single-cascoded configuration without M6 MOSFET 50 and its biasing device M5 MOSFET 48. In the double-cascoded configuration of FIG. 6 in which two cascode devices, M4 device 46 and M6 device 50, along with their biasing devices, M3 device 44 and M5 device 48, respectively, are used, there will be a first and a second interim voltage that will operate to affect the operating region of mirror leg transistors 46 and 50 in two stages. As Vout drops from the maximum voltage towards zero, it will first reach a first interim voltage. At this point, M6 MOSFET device 50 will move from the saturation region to the linear region of operation while M4, M2 MOSFET devices 46, 42 will remain in the saturated region of operation. This has the effect of lowering the high output impedance of Vout, necessary to achieving the linear discharge of capacitor C, that was previously provided by all three transistors 50, 46, 42 operating in the saturation region. Vout, however, is still at a relatively high output impedance owing to the continued operation of MOSFET devices 42 and 46 in the saturation region and the linearity of the discharge operation is not adversely affected. Vout continues to ramp down towards ground and reaches a second, lower interim voltage. At this point, M4 MOSFET device 46 will join device 50 in operating in the linear, low resistance, region of operation, thereby again lowering the output impedance of Vout. Fortunately, the linearity of the discharge of capacitor C, as reflected in Vout, is not affected by this development too much. Vout by this time has decreased to a low enough voltage across M2 MOSFET device 42 that a high impedance output is no longer needed, and the single device M2 MOSFET 42 is of high enough impedance to finish ramping down capacitor C linearly to ground.

As previously noted, it is not necessary to the operation of the invention that the double-cascoded formation shown in FIG. 6 be used. M5 MOSFET device 48 and M6 MOSFET device 50 could be deleted from the circuit, although not as high an output impedance would be achieved without them. Rather than two interim voltages, there would be a single interim voltage that, once reached, would cause M4 MOSFET device 46 to go from a saturated region of operation to a linear region of operation.

The voltage ramp generator 12" of the second embodiment of the invention provides a simple, yet elegant, approach to providing an output voltage between a maximum voltage and ground that is highly linear. No decision-making element, such as a comparator, or switching mechanism is needed to practice this embodiment since the linear discharge of capacitor C is accomplished automatically. Only MOSFET devices are used to automatically adjust Vout while maintain high output impedance, further adding to the linearity that is achieved. Moreover, the costs attendant with combining bipolar and MOS technologies are avoided.

Figure 1:
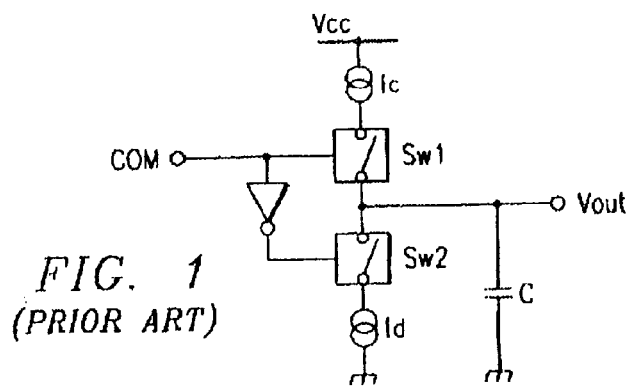
FIG. 1 is a circuit schematic of a voltage ramp generator in accordance with the prior art.
Figure 2:
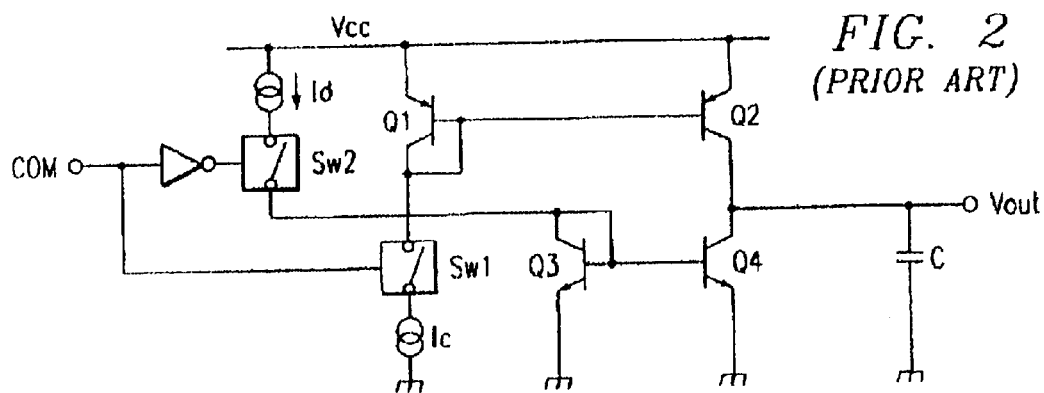
FIG. 2 is a circuit schematic further showing a combination in accordance with the prior art.
Figure 3:
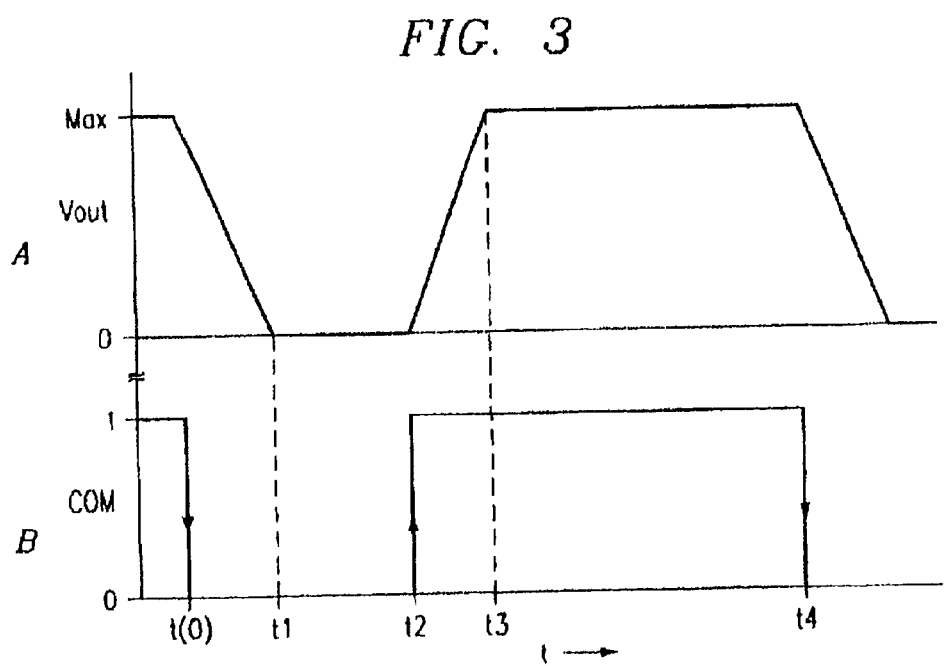
FIG. 3 is a set of waveforms illustrating voltage ramp performance in response to command signals.
Figure 7A:
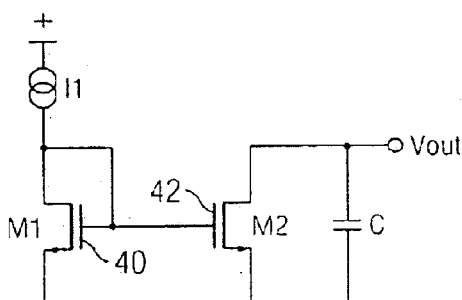
FIG. 7A illustrates a current mirror in accordance with the prior art.
Figure 7B:
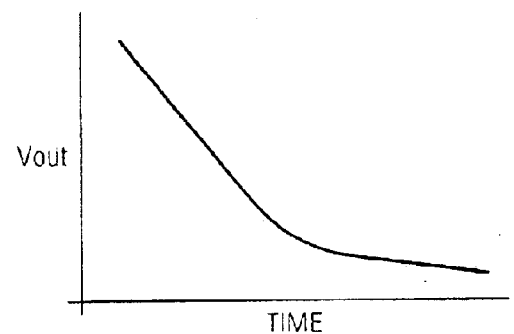
FIG. 7B is a waveform illustrative of the current mirror formation of FIG. 7A.

While the embodiment of FIG. 6 generally provides a highly linear ramp down of Vout towards ground, there is a slight deviation from linearity in the ramp when the ramp voltage Vout gets extremely close to ground and M2 MOSFET device 42 goes into the linear or low resistance region. This occurs after M6 and M4 MOSFET devices 50, 46 go into the linear region and thus FIG. 2 is effectively represented as FIG. 7A. FIG. 7B illustrates the slight deviation from linearity that occurs during the ramping down of Vout as Vout approaches zero volts, or ground. The linearity error of the current mirror is caused because the reference transistor M1 MOSFET device 40 in the mirror is always in the saturated region and is responsible for establishing a fixed gate to source voltage (Vgs) for both M2 MOSFET device 42 and M1 MOSFET device 40. As M2 MOSFET device 42 goes into the triode, or linear, region of operation, since its Vgs is constant, its drain current decreases, thereby causing the capacitor C to discharge at a slower rate. The drain voltage of a MOS transistor controls the region in which the transistor will operate and thus is important to matching between transistors. The slower rate of discharge of capacitor C creates a slight deviation from the desired linearity as Vout ramps down to ground. MOSFET devices 30, 32 of FIG. 5 have a similar deviation from linearity as Vout approaches ground.

Figure 8:
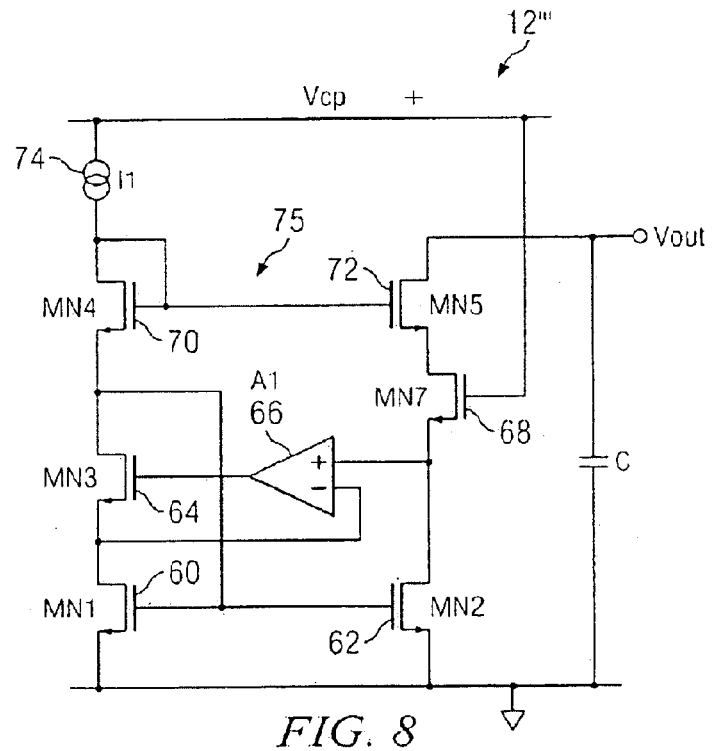
FIG. 8 is a voltage ramp generator in accordance with a third embodiment of the present invention.

Referring now to FIG. 8, a third embodiment of the present invention that overcomes this slight deviation in linearity and thus can ensure a linear ramp down of Vout to ground is illustrated. Voltage ramp generator 12''' overcomes the mirror error illustrated in FIGS. 7A and 7B by ensuring that the transistor in the reference leg of the current mirror is in the same region of operation as the transistor in the mirror leg of the current mirror, regardless of the region of operation of the mirror leg transistor. The circuitry of FIG. 8 relies upon the fact that the drain voltage of a MOS transistor controls the region in which the transistor will operate and thus is important to providing proper matching between transistors.

Voltage ramp generator 12''' has several elements, including I1 reference current 74, MN1, MN2, MN3, MN4, MN5, MN6 MOSFET devices 60, 62, 64, 68, 70, 72, amplifier A1, and capacitor C. Gate-connected MOSFET devices 60 and 62 have their sources coupled to ground. MOSFET device 64 is coupled to MOSFET device 60 at a node and this node is provided as a first, negative input to A1 amplifier 66. MN2 MOSFET device 62 is coupled to MN7 MOSFET device 68 at a node which is provided to the non-inverting input of A1 amplifier 66. Diode-connected MN4 MOSFET device 70 is coupled to MN3 MOSFET device 64 at a node that is coupled to the gates of MN1, MN2 MOSFET devices 60, 62. MN4 MOSFET device 70 and MN5 MOSFET device 72 are gate-connected at a node which is also coupled to I1 reference current 74. I1 reference current 74 is coupled to supply voltage Vcp. MN5 MOSFET device 72 is coupled to MN7 MOSFET device 68 and the gate of MN7 is coupled to supply voltage Vcp as shown. MN5 MOSFET device is coupled to capacitor C at the capacitor output voltage Vout. MN7 MOSFET device 68 operates continuously in the linear region. A1 amplifier 66 should be of a type that can accept input common voltages that include ground and still operate properly. Amplifiers of this type typically have P-channel input transistors as is known in the art.

Cascoded current mirror 75 is formed by the current mirror formed by MN1 device 60 in the reference leg and MN2 device 62 in the mirror leg, MN3 device 64 in the reference leg coupled to MN7 device 68 in the mirror leg via A1 amplifier 66 as shown, and a biasing, diode-connected MN4 MOSFET device 70 in the reference leg that biases cascode MN5 MOSFET device 72 in the mirror leg.

Voltage ramp generator 12''' has an extremely high output impedance which guarantees a linear ramp waveform on capacitor C, but it also has the ability to preserve this linearity far closer to zero than the other embodiments or the prior art. I1 reference current 74 enters the cascoded current mirror 75 at diode-connected MN4 MOSFET device 70 and has a corresponding output at the drain of MN5 cascode MOSFET device 72. For use in creating a ramp caused by the current output discharging capacitor C, the voltage Vout falls linearly with time according to the known relationship, CdV/dt=I. If the current source is capable of keeping current I truly constant over all output voltages of interest, then true linearity of the ramp is achieved.

An examination of the operation of voltage ramp generator 12''' under moderate output voltages of Vout, defined as voltages of Vout equal to or greater than a first interim voltage, such as 1.5 volts, for instance, will now be described. As will be seen, operation at or above the first interim voltage will allow both MN2 device 62 and MN5 device 72 to remain in the saturation regions. Under moderate output voltages of Vout in which both MN2 MOSFET device 62 and MN5 MOSFET device 72 operate in the saturated region, A1 amplifier 66 operates to take the gate voltage of MN3 device 64 to nearly the positive rail, thereby forcing MN3 device 64 to operate deep in the linear, or low resistance, region, with little voltage drop across it. Under these same conditions, assuming that MN7 device 68 is of similar size as MN3 device 64, MN7 device 68 will have a similar Vgs and Vds (drain-to-source voltage) as MN3 device 64, and both branches of the current mirror formed by devices 60 and 62 will be balanced. In this mode of operation, even though amplifier A1 output is near the positive rail, A1 amplifier 66 operates to keep the drain voltage of MN2 device 62 equal to the drain voltage of MN1 device 60, with great precision. MN3 device 64 becomes an effective short and the gate of MN1 device 60 is coupled to its own drain voltage, thereby forcing MN1 device 60 to operate in the saturated region like MN2 device 62. This tends to boost the output impedance seen at the drain of MN5 device 72. If the drain voltage of MN2 device 62 does not change with change of output voltage Vout, then the output current at the drain of MN5 device 72 will be constant over any output voltage Vout.

Now the operation of voltage ramp generator 12''' as the output voltage Vout falls below the first interim voltage towards a second, lower interim voltage will be discussed. As Vout falls below the first interim voltage, to perhaps less than 1.5 volts, for instance, MN5 device 72 and MN2 device 62 no longer both remain in the saturation region. As Vout falls below the first interim voltage, cascoded MN5 device 72 first goes into the linear or low resistance region while MN2 device 62 remains saturated in the high resistance region. Even though MN4 device 70 is saturated while MN5 device 72 is linear, this does not contribute a linearity error to the ramp waveform because the output current at the drain of MN5 device 72 is still controlled by MN2 device 62. As cascode device MN6 becomes linearly biased, some of the high output impedance is lost but not the linearity, due to the operation of MN2 device 62.

As Vout falls even farther, such as below 200 mV, for instance, below the first interim voltage towards a second interim voltage, transistor MN2 also follows MN5 into the linear, or triode, region. This might be expected to create a linearity error in the circuits of FIG. 5, 6, or 7A, but such is not the case in the third embodiment of the invention because MN1 device 60, which controls MN2 device 62, also goes into the linear region a corresponding amount. A1 amplifier 66 operates in a manner to keep the Vds voltages of MN1 device 60 and MN2 device 62 equal. Since both MN1 device 60 and MN2 device 62 share the same Vgs, it can be seen that these two MOSFET devices will have identical Vgs, Vds, and Vbs, so that they will have identical currents going through them and will always operate in the same region, whether saturated or linear. This means that even as the output device MN2 goes deep into the linear region, MN2 still accurately mirrors the input current flowing in MN1 device 60, thereby achieving greater linearity on the ramp waveform on the capacitor C.

It can be seen that the linearity of the ramp down of Vout towards ground is assured by ensuring that MN1 device 60 is in the same region of operation as MN2 device 62 and by maintaining a predetermined relationship between the current flowing through MN1 device 60 and the current flowing through MN2 device 62 over all values of Vout. The goal of maintaining MN1 MOSFET device 60 in the same operating region as MN2 MOSFET device 62 in order to avoid mismatch is achieved.

It is herein noted that voltage ramp generator 12''' of FIG. 8 may be implemented without devices 68, 70, and 72 if desired while still maintaining the linearity of the output voltage Vout ramp waveform in accordance with the invention. MN2 device 62 controls the discharge of the capacitor C and is controlled by MN1 device 60 the biasing arrangement provided by MN3 device 64 and A1 amplifier 66 in the manner described above. The non-inverting input of A1 amplifier 66 and MN2 device would be coupled directly to the output voltage Vout of capacitor C while MN3 device 64 would be coupled directly to I1 reference current.

While the invention has been particularly shown and described with reference to one or more preferred embodiments, it will be understood by those skilled in the art that various changes in form and detail may be made therein without departing from the spirit and scope of the invention.

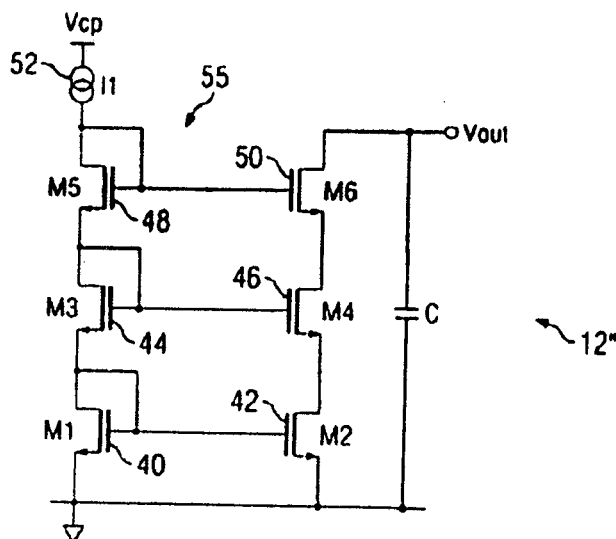

What is claimed is:

1. A voltage ramp generator capable of linearly discharging a capacitor for slew rate control of a power driving stage, comprising;

a cascoded current source that is coupled to an output voltage of the capacitor, a first supply voltage, and a second supply voltage, said cascoded current source comprising:

a current mirror, coupled to the first supply voltage;

a first cascode devise coupled between a mirror leg of the current mirror and the output of the capacitor; and a first biasing device for biasing the first cascode device coupled between a reference leg of the current mirror and the second supply voltage, wherein the current mirror and the first cascode device operate in a high resistance region as the output voltage of the capacitor falls from a third voltage to ensure a high impedance of the output voltage of the capacitor until the output voltage of the capacitor reaches a first interim voltage, and wherein when the output voltage of the capacitor reaches the first interim voltage the first cascode device operates in a low resistance region, the current mirror continues to operate in the high resistance region and an output impedance of the cascoded current source coupled to the capacitor decreases, but the output voltage being at or below the first interim voltage does not require that the output voltage be as high an impedance to continue linearly discharging the capacitor to the first supply voltage.

2. The voltage ramp generator of claim 1, wherein the high resistance region is a saturated region and the low resistance region is a linear region.

3. The voltage ramp generator of claim 1, wherein the current mirror comprises:
   a first diode-connected transistor coupled to the first supply voltage in the reference leg; and
   a second transistor in the mirror leg that is coupled to the first supply voltage;
   the first biasing device serially coupled between the first diode-connected transistor and the first supply voltage in the reference leg; and
   the first cascode device serially coupled between the second transistor and the output voltage of the comparator in the mirror leg; and
   wherein the second transistor and the first cascode device operate in the high resistance region until the output voltage of the capacitor reaches the first interim voltage after which the first cascode device operates in the low resistance region.

4. The voltage ramp generator of claim 3, wherein first transistor, the second transistor, the first biasing device, and the first cascode device are MOSFET devices and the high resistance region is a saturated region and the low resistance region is a linear region.

5. The voltage ramp generator of claim 1, wherein the cascoded current source further comprises:
   a second cascode device coupled in series between the first cascode device and the output voltage of the capacitor in the mirror leg of the current mirror
   a second biasing device for biasing the second cascade device that is coupled in series between the first biasing device and the second supply voltage in the reference leg of the current mirror;
   wherein the current mirror, the first cascode device and the second cascode device operate in the high resistance region as the output voltage of the capacitor falls from the third supply voltage to ensure a high impedance of the output voltage of the capacitor until the output voltage of the capacitor reaches a second interim voltage, wherein the second interim voltage is greater than the first interim voltage;
   wherein when the output voltage of the capacitor reaches the second interim voltage the second cascode device operates in the low resistance region, the first cascode device, and the current mirror continue to operate in the high resistance region and the output voltage of the capacitor continues to be high impedance; and
   wherein when the output voltage of the capacitor reaches the first interim voltage the first and second cascode devices operate in the low resistance region, the current mirror continues to operate in the high resistance region and an output impedance of the cascoded current Source coupled to the capacitor decreases, but the output voltage being at or below the first interim voltage does not require that the output voltage be as high an impedance to continue linearly discharging the capacitor to the first supply voltage.

6. The voltage ramp generator of claim 5, wherein the current mirror comprises:
   a first diode-connected transistor coupled to the first supply voltage in the reference leg; and
   a second transistor in the mirror leg that is coupled to the first supply voltage;
   wherein the first biasing device and the second biasing device area diode-connected transistors; and
   wherein the second transistor, the first cascode device, and the second cascade device operate in the high resistance region until the output voltage of the capacitor reaches the second interim voltage after which the second cascode device operates in the low resistance region; and
   wherein the second transistor an the first cascode device continue to operate in the high resistance region until the output voltage of the capacitor reaches the first interim voltage after which the first and second cascode devices operate in the low resistance region.

7. The voltage ramp generator of claim 6, wherein the first and second transistors, the first and second cascode devices, and the first and the second biasing devices are MOSFET device and the high resistance region is a saturated region and the low resistance region is a linear region.

8. A driver circuit that drives a power device of a power driving stage of a load, comprising;
   an amplifier having an output connected to a control terminal of the power device; and
   a slew rate control system with an output node coupled to an input terminal of the amplifier, said slew rate control system comprising:
      a capacitor with a charge terminal coupled to the slew rate output node and a ground terminal coupled to a low impedance voltage; and
      a voltage ramp generator capable of linearly discharging the capacitor for slow rate control of the power driving stage from a voltage to a first supply voltage, said voltage ramp generator comprising:
         a cascoded current source that is coupled to an output voltage of the capacitor and the first supply voltage, and a second supply voltage, said cascoded current source comprising:
            a current mirror, coupled to the first supply voltage;
            a first cascode device coupled between a mirror leg of the current mirror and the output of the capacitor; and
            a first biasing device for biasing the first cascode device coupled between a reference leg of the current mirror and the second supply voltage;
            wherein the first current mirror and the first cascode device operate in a high resistance region as the output voltage of the capacitor falls from the voltage to ensure a high impedance of the output voltage of the capacitor until the output voltage of the capacitor reaches a first interim voltage, and
            wherein when the output voltage of the capacitor reaches the first interim voltage the first cascode device operates in a low resistance region, the first current mirror continues to operate in the high resistance region and an output impedance of the cascoded current source coupled to the capacitor decreases, but the output voltage being at or below the first interim voltage does not require that the output voltage be as high an output impedance to continue linearly discharging the capacitor to the first supply voltage.

9. The driver circuit of claim 8, wherein the current mirror comprises:

a first diode-connected transistor coupled to the minimum ground voltage in the reference leg; and a second transistor in the mirror leg that is coupled to the first supply voltage;

the first biasing device serially coupled between the first diode-connected transistor end the second supply voltage in the reference leg; and the first cascode device serially coupled between the second transistor and the output voltage of the comparator in the mirror leg; and wherein the second transistor and the first cascode device operate in the high resistance region until the output voltage of the capacitor reaches the first interim voltage after which the first cascode device operates in the low resistance region.

10. The driver circuit of claim 8, wherein the low impedance voltage is equal to the first supply voltage.

11. The driver circuit of claim 8, wherein the cascoded current source further comprises:

a second cascode device coupled in series between the first cascode device and the output voltage of the capacitor in the mirror leg of the current mirror;

a second biasing device for biasing the second cascode device that is coupled in series between the first biasing device and the second supply voltage in the reference leg of the current mirror;

wherein the current mirror, the first cascode device and the second cascode device operate in the high resistance region as the output voltage of the capacitor falls from the supply voltage to ensure a high impedance of the output voltage of the capacitor until the output voltage of the capacitor reaches a second interim voltage, wherein the second interim voltage is greater than the first interim voltage;

wherein when the output voltage of the capacitor reaches the second interim voltage the second cascode device operates in the low resistance region, the first cascode device, and the current mirror continue to operate in the high resistance region and the output voltage of the capacitor continues to be high impedance; and wherein when the output voltage of the capacitor reaches the first interim voltage the first and second cascode devices operate in the low resistance region, the current mirror continues to operate in the high resistance region, and the output voltage of the capacitor is no longer high impedance, but the output voltage being at or below the first interim voltage does not require that the output voltage be as high an output impedance to continue linearly discharging the capacitor to the first supply voltage.

12. The driver circuit of claim 11, wherein the current mirror comprises:

a first diode-connected transistor coupled to the first supply voltage in the reference leg; and a second transistor in the mirror leg that is coupled to the first supply voltage;

wherein the first biasing device and the second biasing devices are diode connected transistors;

wherein the second transistor, the first cascode device, and the second cascode device operate in the high resistance region until the output voltage of the capacitor reaches the second interim voltage after which the second cascade device operates in the low resistance region; and wherein the second transistor and the first cascode device continue to operate in the high resistance region until the output voltage of the capacitor reaches the first interim voltage after which the first and second cascode devices operate in the low resistance region.

13. A method of linearly discharging a capacitor for slew rate control of a power driving stage, comprising:

ramping an output voltage of the capacitor from a voltage to a first interim voltage;

when the first interim voltage is reached, a first cascode transistor of a cascoded current source going from a high resistance region of operation to a low resistance region of operation thereby lowering an output impedance of the output voltage and a first transistor of the cascoded current source continuing to operate in the high resistance region of operation; and ramping the output voltage from the first interim voltage to a supply voltage.

14. The method of claim 13, after ramping the output voltage to the first interim voltage, further comprising:

ramping the output voltage from the first interim voltage to a second interim voltage with the first cascode transistor operating in the low resistance region of operation and the first transistor continuing to operate in the high resistance region;

when the second interim voltage is reached, a second cascode transistor of the cascoded current source going from the high resistance region of operation to the low resistance region of operation thereby further lowering the output impedance of the output voltage, the first cascode transistor continuing to operate in the low resistance region of operation, and the first transistor of the cascoded current source continuing to operate in the high resistance region of operation; and ramping the output voltage from the second interim voltage to the supply voltage.

* * * * *

UNITED STATES PATENT AND TRADEMARK OFFICE
CERTIFICATE OF CORRECTION

PATENT NO.     : 6,900,672 B2
DATED          : May 31, 2005
INVENTOR(S)    : Michael J. Callahan, Jr.

It is certified that error appears in the above-identified patent and that said Letters Patent is hereby corrected as shown below:

The title page, showing an illustrative figure, should be deleted and substitute therefore the attached title page.

Drawings,
Sheet 2, Figure 5, the informal drawing should be replaced with a formal drawing, as shown below:

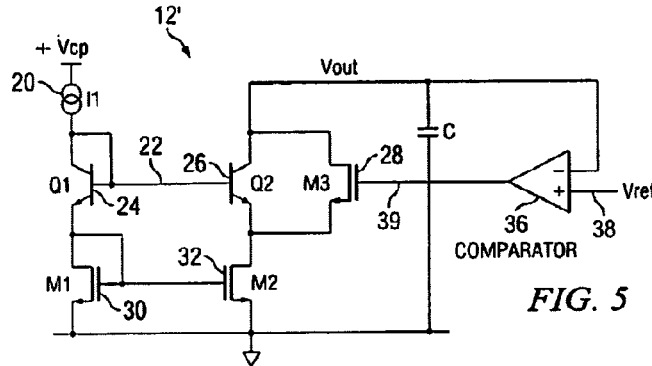

FIG. 5

Sheet 3, Figure 6, the informal drawing should be replaced with a formal drawing, as shown below:

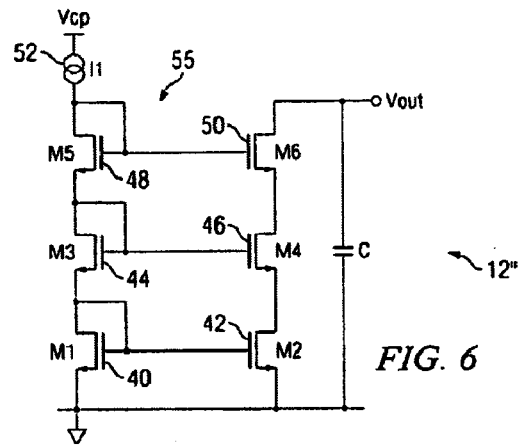

FIG. 6

UNITED STATES PATENT AND TRADEMARK OFFICE
CERTIFICATE OF CORRECTION

PATENT NO. : 6,900,672 B2
DATED : May 31, 2005
INVENTOR(S) : Michael J. Callahan, Jr.

It is certified that error appears in the above-identified patent and that said Letters Patent is hereby corrected as shown below:

<u>Column 1,</u>
Line 9, insert the following priority claim paragraph
-- PRIORITY CLAIM
This application claims priority from parent U.S. patent application titled "DRIVER CIRCUIT HAVING A SLEW RATE CONTROL SYSTEM WITH IMPROVED LINEAR RAMP GENERATOR INCLUDING GROUND," filed March 31, 2000, identified by Application No. 09/540,865, which issued as U.S. Patent No. 6,586,980, on July 1, 2003, and with which pendency with the instant application was properly established prior to issuance. --.

Signed and Sealed this

Thirtieth Day of August, 2005

JON W. DUDAS
*Director of the United States Patent and Trademark Office*

(12) United States Patent
Callahan, Jr.

(10) Patent No.: US 6,900,672 B2
(45) Date of Patent: May 31, 2005

(54) DRIVER CIRCUIT HAVING A SLEW RATE CONTROL SYSTEM WITH IMPROVED LINEAR RAMP GENERATOR INCLUDING GROUND

(75) Inventor: Michael J. Callahan, Jr., Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/401,623

(22) Filed: Mar. 28, 2003

(65) Prior Publication Data

US 2004/0189362 A1 Sep. 30, 2004

(51) Int. Cl.[7] .................................................. H03B 1/00
(52) U.S. Cl. ....................... 327/108; 327/170; 327/132
(58) Field of Search ................................ 327/170, 108, 327/111, 261, 130–134, 136, 53, 66; 323/312, 313, 315

(56) References Cited

U.S. PATENT DOCUMENTS

| | | | |
|---|---|---|---|
| 4,803,381 A | | 2/1989 | Gornati et al. |
| 5,177,374 A | | 1/1993 | Carpenter et al. |
| 5,191,269 A | | 3/1993 | Carobolante |
| 5,306,988 A | | 4/1994 | Carobolante et al. |
| 5,311,115 A | * | 5/1994 | Archer ..................... 323/315 |
| 5,374,857 A | | 12/1994 | Carobolante |
| 5,428,303 A | * | 6/1995 | Pasqualini ................. 326/27 |
| 5,512,854 A | | 4/1996 | Park |
| 5,514,939 A | | 5/1996 | Schlager et al. |
| 5,627,487 A | | 5/1997 | Keeth |
| 5,712,509 A | | 1/1998 | Harada et al. |
| 5,714,897 A | | 2/1998 | Victunic et al. |
| 5,739,707 A | | 4/1998 | Barraclough |
| 5,742,193 A | * | 4/1998 | Colli et al. ................. 327/170 |
| 5,767,708 A | | 6/1998 | Groeneveld et al. |
| 5,825,218 A | | 10/1998 | Colli et al. |
| 5,828,245 A | * | 10/1998 | Brambilla et al. ......... 327/108 |
| 5,883,798 A | | 3/1999 | Yamaguchi |
| 5,939,909 A | | 8/1999 | Callahan, Jr. |
| 6,169,456 B1 | | 1/2001 | Pauls |
| 6,586,980 B1 | * | 7/2003 | Callahan, Jr. .............. 327/170 |
| 6,650,153 B2 | * | 11/2003 | Zerilli et al. ............... 327/134 |

OTHER PUBLICATIONS

Gariboldi, "Motion Control," appearing in *Smart Power ICs*, Murari et al., Eds., 1995, Ch. 6, pp. 225–283.
Grebene, "Bipolar and MOS Analog Integrated Circuit Designs," 1984, Sec. 4.1, pp. 171–183, and Sec. 6.2, pp. 272–277.

* cited by examiner

*Primary Examiner*—Timothy P. Callahan
*Assistant Examiner*—Hai L. Nguyen
(74) *Attorney, Agent, or Firm*—Lisa K. Jorgenson; Renee Michelle Larson

(57) ABSTRACT

Methods and structures for ensuring the highly linear discharge of a capacitor used for slew rate control of a power driving stage from a maximum voltage to a minimum supply voltage, such as ground. A voltage ramp generator uses a single cascoded current source to achieve the linear ramp-down.

14 Claims, 4 Drawing Sheets

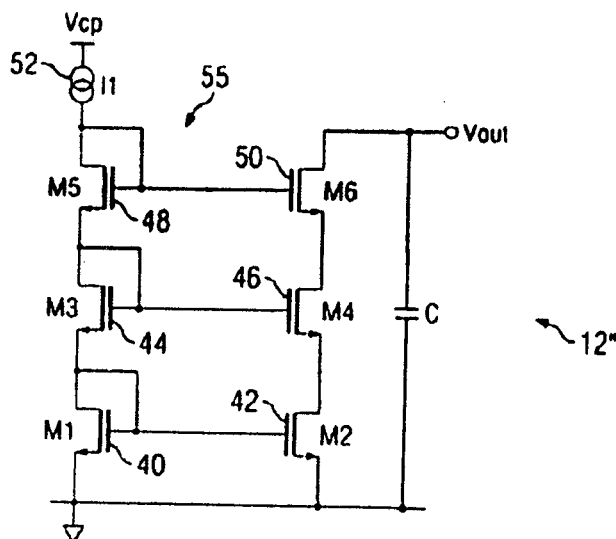

UNITED STATES PATENT AND TRADEMARK OFFICE
CERTIFICATE OF CORRECTION

PATENT NO.      : 6,900,672 B2
DATED           : May 31, 2005
INVENTOR(S)     : Michael J. Callahan, Jr.

It is certified that error appears in the above-identified patent and that said Letters Patent is hereby corrected as shown below:

The title page, showing an illustrative figure, should be deleted and substitute therefore the attached title page.

<u>Drawings</u>,
Sheet 2, Figure 5, the informal drawing should be replaced with a formal drawing, as shown below:

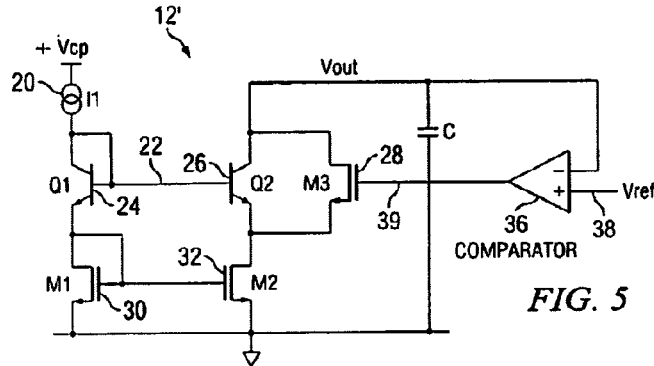

FIG. 5

Sheet 3, Figure 6, the informal drawing should be replaced with a formal drawing, as shown below:

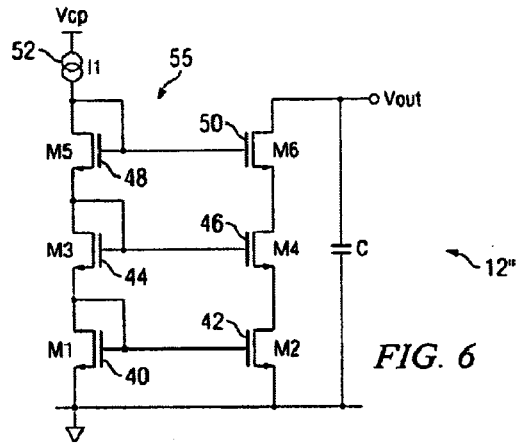

FIG. 6

UNITED STATES PATENT AND TRADEMARK OFFICE
CERTIFICATE OF CORRECTION

PATENT NO. : 6,900,672 B2
DATED : May 31, 2005
INVENTOR(S) : Michael J. Callahan, Jr.

It is certified that error appears in the above-identified patent and that said Letters Patent is hereby corrected as shown below:

<u>Column 1</u>,
Line 9, insert the following priority claim paragraph
-- PRIORITY CLAIM
This application is a divisional of and claims priority to parent U.S. patent application titled "DRIVER CIRCUIT HAVING A SLEW RATE CONTROL SYSTEM WITH IMPROVED LINEAR RAMP GENERATOR INCLUDING GROUND," filed March 31, 2000, identified by Application No. 09/540,865, which issued as U.S. Patent No. 6,586,980, on July 1, 2003, and with which pendency with the instant application was properly established prior to issuance. --.

This certificate supersedes Certificate of Correction issued August 30, 2005.

Signed and Sealed this

Twenty-fifth Day of April, 2006

JON W. DUDAS
*Director of the United States Patent and Trademark Office*

(12) United States Patent  
Callahan, Jr.

(10) Patent No.: US 6,900,672 B2  
(45) Date of Patent: May 31, 2005

(54) DRIVER CIRCUIT HAVING A SLEW RATE CONTROL SYSTEM WITH IMPROVED LINEAR RAMP GENERATOR INCLUDING GROUND

(75) Inventor: Michael J. Callahan, Jr., Austin, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 10/401,623

(22) Filed: Mar. 28, 2003

(65) Prior Publication Data

US 2004/0189362 A1 Sep. 30, 2004

(51) Int. Cl.[7] .................................................. H03B 1/00
(52) U.S. Cl. ........................ 327/108; 327/170; 327/132
(58) Field of Search ................................. 327/170, 108, 327/111, 261, 130–134, 136, 53, 66; 323/312, 313, 315

(56) References Cited

U.S. PATENT DOCUMENTS

| | | | |
|---|---|---|---|
| 4,803,381 A | | 2/1989 | Gornati et al. |
| 5,177,374 A | | 1/1993 | Carpenter et al. |
| 5,191,269 A | | 3/1993 | Carobolante |
| 5,306,988 A | | 4/1994 | Carobolante et al. |
| 5,311,115 A | * | 5/1994 | Archer ..................... 323/315 |
| 5,374,857 A | | 12/1994 | Carobolante |
| 5,428,303 A | * | 6/1995 | Pasqualini ................. 326/27 |
| 5,512,854 A | | 4/1996 | Park |
| 5,514,939 A | | 5/1996 | Schlager et al. |
| 5,627,487 A | | 5/1997 | Keeth |
| 5,712,509 A | | 1/1998 | Harada et al. |
| 5,714,897 A | | 2/1998 | Victunic et al. |
| 5,739,707 A | | 4/1998 | Barraclough |
| 5,742,193 A | * | 4/1998 | Colli et al. ................. 327/170 |
| 5,767,708 A | | 6/1998 | Groeneveld et al. |
| 5,825,218 A | | 10/1998 | Colli et al. |
| 5,828,245 A | * | 10/1998 | Brambilla et al. .......... 327/108 |
| 5,883,798 A | | 3/1999 | Yamaguchi |
| 5,939,909 A | | 8/1999 | Callahan, Jr. |
| 6,169,456 B1 | | 1/2001 | Pauls |
| 6,586,980 B1 | * | 7/2003 | Callahan, Jr. ............... 327/170 |
| 6,650,153 B2 | * | 11/2003 | Zerilli et al. .............. 327/134 |

OTHER PUBLICATIONS

Gariboldi, "Motion Control," appearing in *Smart Power ICs*, Murari et al., Eds., 1995, Ch. 6, pp. 225–283.
Grebene, "Bipolar and MOS Analog Integrated Circuit Designs," 1984, Sec. 4.1, pp. 171–183, and Sec. 6.2, pp. 272–277.

* cited by examiner

*Primary Examiner*—Timothy P. Callahan
*Assistant Examiner*—Hai L. Nguyen
(74) *Attorney, Agent, or Firm*—Lisa K. Jorgenson; Renee Michelle Larson

(57) ABSTRACT

Methods and structures for ensuring the highly linear discharge of a capacitor used for slew rate control of a power driving stage from a maximum voltage to a minimum supply voltage, such as ground. A voltage ramp generator uses a single cascoded current source to achieve the linear ramp-down.

14 Claims, 4 Drawing Sheets